US011353940B2

(12) United States Patent
Seiler et al.

(10) Patent No.: US 11,353,940 B2
(45) Date of Patent: Jun. 7, 2022

(54) THERMAL PROFILES

(71) Applicant: Hewlett-Packard Development Company, L.P., Spring, TX (US)

(72) Inventors: Peter Seiler, Fort Collins, CO (US); Adolfo Gomez, Fort Collins, CO (US); Hoang Ngo, Spring, TX (US)

(73) Assignee: Hewlett-Packard Developmet Company, L.P., Spring, TX (US)

( * ) Notice: Subject to any disclaimer, the term of this patent is extended or adjusted under 35 U.S.C. 154(b) by 0 days.

(21) Appl. No.: 17/044,902

(22) PCT Filed: Oct. 14, 2018

(86) PCT No.: PCT/US2018/055788
§ 371 (c)(1),
(2) Date: Oct. 2, 2020

(87) PCT Pub. No.: WO2020/081042
PCT Pub. Date: Apr. 23, 2020

(65) Prior Publication Data
US 2021/0365089 A1    Nov. 25, 2021

(51) Int. Cl.
*G06F 1/20* (2006.01)
*H05K 7/20* (2006.01)

(52) U.S. Cl.
CPC .............. *G06F 1/206* (2013.01); *G06F 1/203* (2013.01); *H05K 7/20136* (2013.01); *H05K 7/20209* (2013.01)

(58) Field of Classification Search
CPC . G06F 1/20; G06F 1/203; G06F 1/206; G06F 1/1688; G06F 1/1684; H04M 1/6058; H04M 1/0202; H04M 2250/12; H04R 5/033; H05K 7/20209; H05K 7/20; H05K 7/20136
See application file for complete search history.

(56) References Cited

U.S. PATENT DOCUMENTS

| 6,029,119 | A | 2/2000 | Atkinson et al. |
| 9,753,598 | B2 | 9/2017 | Lo et al. |
| 10,254,636 | B1 * | 4/2019 | Vacura ................. H04N 9/3135 |
| 2007/0027580 | A1 * | 2/2007 | Ligtenberg ............ G05D 23/19 |
| | | | 700/300 |

(Continued)

FOREIGN PATENT DOCUMENTS

TW    201540167    * 10/2015
WO    WO-2014052242    4/2014

OTHER PUBLICATIONS

Chung C, Electronic Device Control Method Rotating Speed Fan Can Adjust Accord System Temperature, Oct. 16, 2015, Espacenet English document translate (Year: 2015).*

(Continued)

*Primary Examiner* — Michael A Matey
(74) *Attorney, Agent, or Firm* — Brooks, Cameron & Huebsch PLLC

(57) ABSTRACT

An example apparatus comprising a heat dissipation mechanism and a controller to detect a temperature of a surface of the apparatus, in response to detecting that an audio output device is connected to the apparatus, determine a thermal profile, and instruct the heat dissipation mechanism to dissipate heat from the apparatus based on the thermal profile.

16 Claims, 6 Drawing Sheets

(56) References Cited

U.S. PATENT DOCUMENTS

| | | | |
|---|---|---|---|
| 2011/0216921 A1 | 9/2011 | Tseng et al. | |
| 2011/0251733 A1* | 10/2011 | Atkinson | G06F 1/206 |
| | | | 700/300 |
| 2011/0273378 A1* | 11/2011 | Alameh | H04M 1/72454 |
| | | | 345/173 |
| 2012/0072044 A1* | 3/2012 | Slaby | G06F 1/1626 |
| | | | 700/299 |
| 2012/0072157 A1* | 3/2012 | Alameh | G01K 13/00 |
| | | | 702/99 |
| 2012/0182686 A1* | 7/2012 | Tang | G06F 1/20 |
| | | | 361/679.54 |
| 2012/0253490 A1* | 10/2012 | Su | G05D 23/19 |
| | | | 700/94 |
| 2013/0066474 A1* | 3/2013 | Coogan | G05D 23/1905 |
| | | | 700/278 |
| 2013/0312429 A1* | 11/2013 | Greuet | F25B 9/14 |
| | | | 62/6 |
| 2014/0304430 A1* | 10/2014 | Salley | G06F 13/102 |
| | | | 710/10 |
| 2015/0018053 A1* | 1/2015 | Chou | G06F 1/203 |
| | | | 455/575.1 |
| 2017/0094037 A1* | 3/2017 | Gaurav | H04M 1/6066 |
| 2017/0219240 A1* | 8/2017 | Cassini | G06F 1/206 |
| 2018/0194361 A1* | 7/2018 | Dudar | B60W 10/30 |
| 2019/0310694 A1* | 10/2019 | Davis | G01K 13/00 |
| 2019/0385564 A1* | 12/2019 | Pincenti | G09G 5/02 |
| 2021/0141428 A1* | 5/2021 | Lin | G05B 15/02 |

OTHER PUBLICATIONS

Chung C, Electronic Device Control Method Rotating Speed Fan Can Adjust Accord System Temperature, Oct. 16, 2015, Espacenet original document (Year: 2015).*

Speedfan, http://www.almico.com/sfdownload.php, Aug. 27, 2018.

* cited by examiner

THERMAL PROFILES

BACKGROUND

The temperature of a surface of a computing device can increase while in use. In some instances, a temperature of a surface of the computing device can increase to a temperature that can be uncomfortably hot for a user interacting with the computing device.

DETAILED DESCRIPTION

A computing device can generate heat during operation of the computing device. As such, a temperature of a surface of the computing device can become elevated relative to an ambient temperature of an environment surrounding the computing device. A given temperature of the surface of the computing device can be perceived by a user as the user interacts with the computing device. In some instances, a temperature of the surface of the computing device, which can be felt by a user, can become too high (hot) for a given user, As such, some approaches can attempt to detect whether a user is proximate to a computing device and change a temperature of the computing device depending on whether a user is proximate or not. However, such approaches may not provide for a level of control beyond whether a user is present or not. For instance, such approaches may not account for whether an audio device is connected to a computing device and/or may not account for a type of audio device to output audio from a computing device, among other unaccounted for aspects.

Accordingly, the disclosure is directed to thermal profiles. For instance, a controller can detect a temperature of a surface of the apparatus, detect that an audio output device is connected to the apparatus, determine a thermal profile responsive to the detection that the audio output device is connected to the apparatus, and instruct the heat dissipation mechanism to dissipate heat from the apparatus in accordance with the determined thermal profile, as described herein. As such, thermal profiles can provide enhanced control of a temperature of a computing device by accounting for whether an audio device is connected to a computing device and/or a type of audio device to output audio from a computing device.

As used herein, a "thermal profile" refers to instructions executable by a processing resource to control an operating temperature of a computing device. For instance, a thermal profile can control an operating temperature of a computing device in accordance with a temperature threshold. As used herein, a "temperature threshold" refers to a specified temperature (i.e., a set temperature) of a surface of a computing device, For instance, a temperature threshold can be a temperature of a surface which is not to be exceeded. As an example, a temperature threshold can be 27 degrees Celsius, among other possible values of a temperature threshold to maintain a given level of user comfort.

Figure 1:
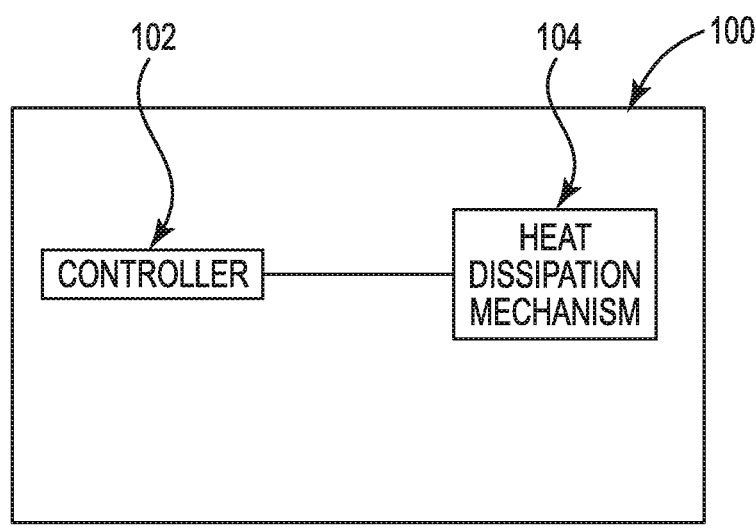
FIG. 1 illustrates an apparatus to determine a temperature threshold in accordance with a thermal profile consistent with the disclosure.

FIG. 1 illustrates an apparatus 100 to determine a temperature threshold in accordance with a thermal profile consistent with the disclosure. The apparatus 100 can be a notebook, a netbook, a desktop, a tablet, and/or another type of computing device. As illustrated in FIG. 1, the apparatus 100 can include a controller 102 and a heat dissipation mechanism 104, among other components.

As used herein, a heat dissipation mechanism refers to a component that can reduce an operating temperature of an apparatus such as the apparatus 100. Lowering the operating temperature of the apparatus refers to lowering a surface temperature of the apparatus. The heat dissipation mechanism 104 can be an air-cooled blower such as a centrifugal fan and/or a liquid cooled apparatus, among other possible heat dissipation mechanism. As used herein, the term "blower" can refer to an accessory or component of a computing device that can decrease an operating temperature of a computing device by changing a volume and/or a direction of airflow around and/or inside of the computing device. For instance, a blower can receive air and, through centrifugal force or otherwise, blow the air out in a different direction and/or different speed. In any case, the flow of air out of the blower can cool the computing device to lower an operating temperature of the computing device via convention or otherwise discharging heat from by a surface of the computing device.

The controller 102 can be a hardware component to instruct the heat dissipation mechanism 104 to dissipate heat according to a determined thermal profile. For instance, the controller 102 can control an amount, speed, and/or direction of air flow from a heat dissipation mechanism to dissipate heat in accordance with a determined thermal profile. Although the disclosure is not so limited, Rather, in some examples the controller 102 can control a volume, temperature, and/or direction, among other possible components of a liquid cooled apparatus to dissipate heat in accordance with a determined thermal profile.

A particular temperature threshold can be determined based on:

i) whether an audio output device is connected to the apparatus 100;

ii) a type of audio output device connected to the apparatus 100, iii) a selected temperature threshold;

iv) a status of an application, and/or i) a surface temperature of the apparatus 100, as described herein.

For instance, the controller 102 can determine a thermal profile that corresponds to a type of audio output device connected to the apparatus 100. In such examples, different types of audio output devices (e.g., headphones, etc.) can have different corresponding thermal profiles. As used herein, an "audio output device" refers to a device that can connect to a computing device to emit sounds when connected to the computing device. Audio output devices can be internal devices or external devices with respect to a housing (not illustrated) of the computing device. Examples of internal audio output devices include internal speakers and/or sound cards. Examples of external audio output devices include external speakers, headphones, and/or headsets such as those including headphones and/or a microphone. External audio output devices can be connected to a computing device via various wired connectors such as 3.5 millimeter connectors, a universal serial bus (USB) connector and/or various wireless connectors such as a BLUETOOTH and/or Wi-Fi connector.

As mentioned, a thermal profile can be determined based on a selected temperature threshold. That is, in some examples, the temperature threshold can be selectable. For instance, a temperature threshold can be selected by the controller 102 and/or by a user. In some examples, a plurality of temperature thresholds (e.g., 22 degree Celsius, 27 degree Celsius, etc.) can be displayed via a graphical user device to a user to permit selection of a temperature threshold (e.g., 27 degree Celsius) from the plurality of temperature thresholds. While described in the above examples as a particular value (27 degree Celsius) it is understood that a temperature threshold can be a range of values (e.g., 25 to 30 degree Celsius, etc.) within which an operating temperature of the computing device can be maintained.

As mentioned, a thermal profile can be determined based on a status of an application. As used herein, the term "application" refers to instructions to perform a group of coordinated functions, tasks, or activities when executed. Examples of applications include a word processor, a spreadsheet, a web browser, a media player, among other types of applications Different thermal profiles can correspond to the execution of different applications in the apparatus 100.

As mentioned, a thermal profile can be determine based on whether an audio output device is connected to an apparatus 100 (e.g., a computing device). For instance, an apparatus 100 can have media application executable to play a movie or other content having video and sound content for a user to perceive. In such examples, a user selects an increased temperature threshold (relative to a current temperature threshold) when the apparatus 100 is running a media application and an audio output device (e.g., headphones) is not connected to the apparatus 100. The increased temperature threshold can allow a surface temperature of the apparatus 100 to increase and therefore decrease the amount and/or frequency of sound generated by the heat dissipation mechanism 104 so the user can readily hear the audio. Conversely, a user can select a decreased temperature threshold when the apparatus 100 is running a media player and an audio output device (e.g., headphones) is connected to the apparatus, The decreased temperature threshold can maintain a low temperature of the apparatus through an increased amount and/or frequency of sound generated by the heat dissipation mechanism and yet not interfere with the user experience as the user perceives the audio via headphone.

As mentioned, the controller 102 can determine a thermal profile based on the surface temperature of the apparatus 100, As used herein, a "surface temperature": of the apparatus 100 refers to an external surface temperature of the apparatus 100 (e.g., a computing device). In various examples, the controller 102 can detect the surface temperature of the apparatus 100 by a thermometer, infrared sensor or other sensor. By detecting the surface temperature of the apparatus 100, the controller 102 can determine a difference between the detected surface temperature and a temperature threshold and make can instruct the heat dissipation mechanism 104 to dissipate heat until or in a particular manner (speed of rotation, etc.) until the detected surface temperature is at or less than the temperature threshold. Though, in some examples the controller 102 can instruct heat dissipation mechanism 104 to dissipate heat in different manner (e.g., a higher or lower rate of rotation and/or interval of operation of the heat dissipation mechanism) depending on a magnitude of the difference between the detected surface temperature and the temperature threshold. For instance, a greater magnitude can result in a higher rate of rotation than a smaller magnitude.

The apparatus 100 can include a memory component to store a plurality of thermal profiles. As used herein, the term "memory component" refers to an integrated circuit or other volatile/non-volatile storage mechanism that stores information. In some examples, the memory component can include ferroelectric RAM, NOR flash, programmable read-only memory (e.g., FPROM, EEPROM, OTP NVM, etc.) and/or RAM, among other volatile and/or non-volatile memory resources. The plurality of thermal profiles stored in the memory component can include distinct temperature thresholds.

Figure 2:
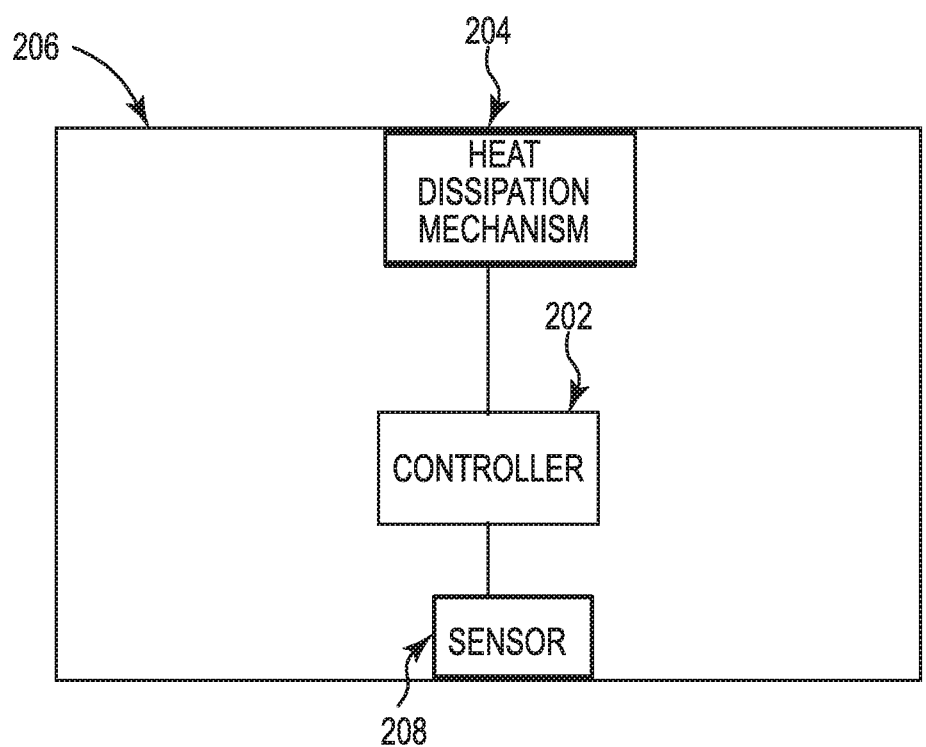
FIG. 2 illustrates a computing device to determine a temperature threshold according to a thermal profile consistent with the disclosure.

FIG. 2 illustrates a computing device 206 to determine a temperature threshold according to a thermal profile consistent with the disclosure. The computing device 206 can include a controller 202, a sensor 208 and a heat dissipation mechanism 204, The sensor 208 can be an optical sensor, an infrared sensor, a time of flight sensor, a capacitive sensor, a key included in a keyboard or other input device such as a mouse, and/or other type of sensor suitable to promote aspects of thermal profiles, as described herein. The sensor 208 can detect a presence and, in some examples, a type of contact with the computing device 206, As used herein, a "presence of contact" refers to the presence or absence of any type of contact (from the perspective of the sensor 208), As used herein, a "type of contact" can refer to a mechanism of user contact or physical interaction with the computing device 206. Examples of types of contact included a user's hand contacting the computing device 206 and/or a separate object such as a stylus contacting the computing device 206. As used herein, the term "stylus" can refer to a small pen-shaped instrument that is used to input commands to a computer screen, mobile device, or graphics tablet.

The controller 202 can modify a temperature threshold of the computing device 206, The controller 202 can modify a temperature threshold from a current temperature threshold to a determined (or more recently determined) temperature threshold. For instance, the controller 202 can modify a temperature threshold to a temperature threshold responsive to the detection of a presence of contact with the computing device 206, among other possibilities.

The controller 202 can instruct a heat dissipation mechanism 204 to dissipate heat from the computing device 206 based on the determined temperature threshold. The heat dissipation mechanism 206 can be an internal component or an external component. For instance, as mentioned the heat dissipation mechanism 204 can be a blower, among other possibilities.

In some examples, the controller 202 can determine a thermal profile based on whether headphones are connected to the computing device 206. For instance, if a user is listening to audio from the computing device 206 through headphones, the user may not be able to hear ambient sound as well as if the user was not using headphones. This can cause the sound generated by the heat dissipation mechanism 204 to be less of an inconvenience to the user who is listening to audio through headphones. Therefore, a thermal profile corresponding to the detection of headphones connected to the computing device 206 can feature a lower temperature threshold since the sound from the heat dissipation mechanism 204 may not cause an inconvenience to the user.

In some examples, the controller 202 can determine a thermal profile based on whether a headset including headphones and a microphone is connected to the computing device 206. Although the user's use of headphones to listen to audio can decrease the inconvenience caused by the sound generated by the heat dissipation mechanism 204, the user can want to communicate through the microphone. The sound generated by the heat mechanism 204 can now be an inconvenience to the user because the sound generated by the heat dissipation mechanism 204 can be picked up by the microphone and interfere with the user's ability to clearly communicate through the microphone. Therefore, a thermal profile corresponding to detection of a headset featuring headphones and a microphone can feature a higher temperature threshold to lessen the inconvenience the sound generated by the heat dissipation mechanism 204 can cause the user.

In some examples, the controller 202 can determine a thermal profile based on detection of whether the computing device 206 is playing a video. That is, the controller 202 can detect when the computing device 206 is playing a video. When a user is watching a video, the sound generated by the heat dissipation mechanism 204 can cause an inconvenience for the user by distracting from the sound of the video. Therefore, a determined thermal profile corresponding to the detection of the computing device 206 playing a video could have a higher temperature threshold.

In some examples, the controller 202 can determine a thermal profile based on detection of a mode of operation of the computing device 206. An example of a mode of operation for the computing device 206 can be a game mode. Game mode can increase the performance (e.g., by overclocking or otherwise increasing a processing speed, etc.) of the computing device 206 to provide the user with a more enjoyable gaming experience. The increased performance can include better graphics and less slowdown within the game being played by the user. A determined thermal profile corresponding to the detection of the computing device 206 being in game mode could have a higher temperature threshold than a temperature threshold of a thermal profile when the computing device is in a different mode of operation (e.g., non-gaming mode, etc.). A higher temperature threshold can allow a computing device 206 to increase the performance of its graphical components, A higher temperature threshold can also decrease the performance and sound generated by the heat dissipation mechanism 204 to decrease the inconvenience the sound can cause the user.

In some examples, the controller 202 can determine a thermal profile based on the use of a wireless accessory such as a wireless keyboard. When a user uses a wireless keyboard to interact with the computing device 206, the input from the keyboard can be transferred to the computing device 206 through a wireless signal, The wireless signal can be representative of an input, such as a keystroke by a user, received by the wireless keyboard. The controller can detect such a wireless (or similar wired) signal. When using a wireless keyboard, the user may not be touching the computing device 206. Therefore, a thermal profile corresponding to the detection of the use of a wireless keyboard can have a higher temperature threshold.

Figure 3:
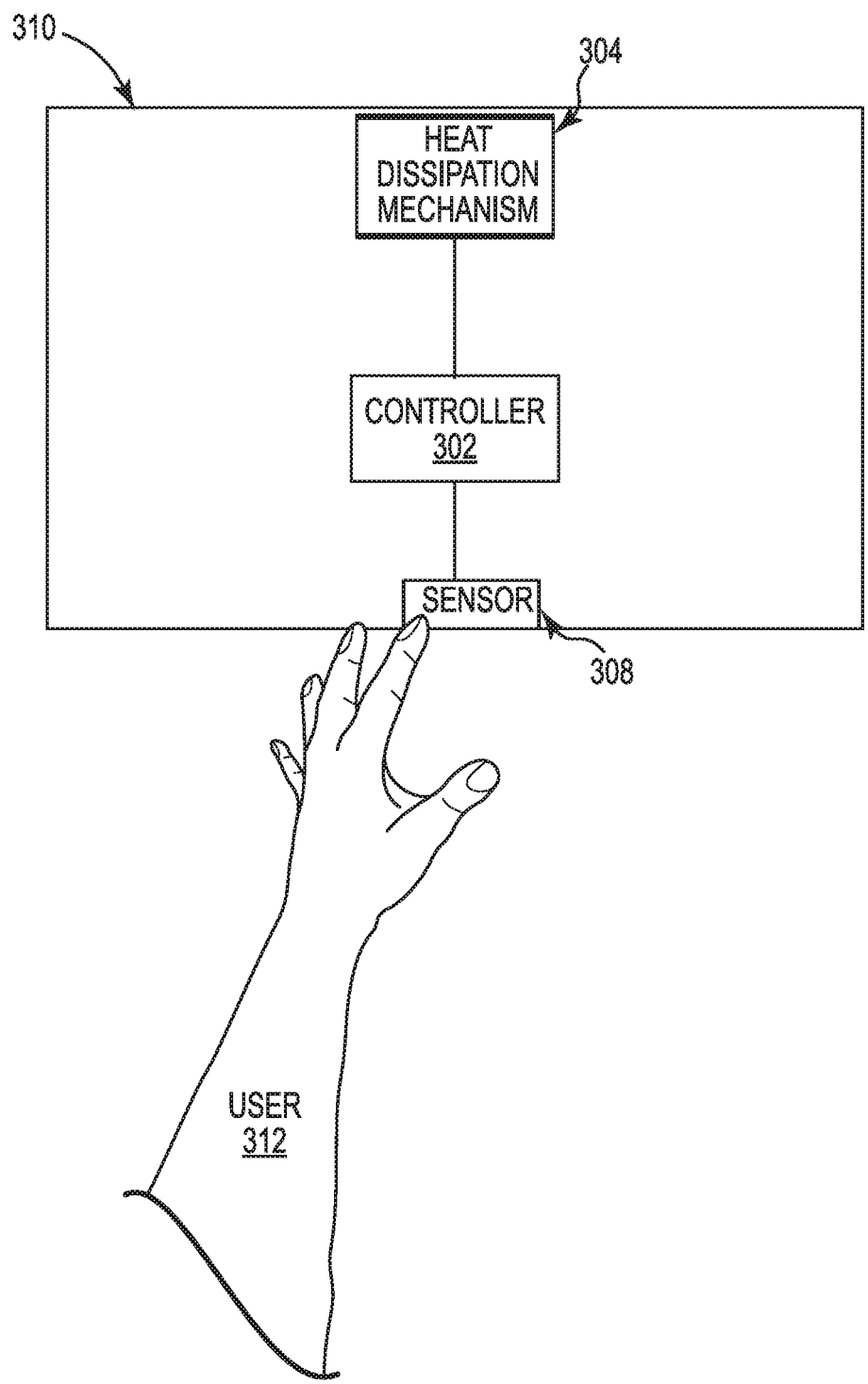
FIG. 3 illustrates a computing device to determine a temperature threshold according to thermal profile consistent with the disclosure.

FIG. 3 is analogous or similar to FIG. 2. As illustrated in FIG. 3, the computing device 310 can include a controller 302, a heat dissipation mechanism 304, a sensor 308, and a user 312. The sensor 308 can detect a user 312 touching a computing device 310. The user 312 can be any person which can touch, hold, reposition, or otherwise contact the portable computing device 310. As mentioned, the sensor 308 can be a capacitive sensor, a touch sensor, a proximity sensor, an infra-red component, and an image capture component to detect for a finger, palm, and/or hand of the user 312 touching a portion of the computing device 310. However, in some examples, the sensor 308 can be an accelerometer, a gyroscope, and/or a global positioning system component to detect repositioning or other movement of the computing device 310 or detect the computing device 310 is stationary, If the sensor 308 detects the computing device 310 repositioning, the user 312 can be determined to be touching or holding the computing device 310, If the sensor 308 does not detect the computing device 310 repositioning for a predefined amount of time, the user 312 can be determined to not be touching or holding the computing device 310, The predefined amount of time can be specified by the controller 302, the sensor 308, and/or the user 312.

In some examples, the sensor 308 can include a docking component and the sensor 308 can detect if the computing device 310 is connected to the docking component. The docking component can include a base or an expansion device which includes a component, such as a keyboard, a touchpad, a storage component, and/or a display component, for the computing device 310. If the sensor 308 detects the computing device 310 connected to the docking station, the user 312 will be determined to not be touching the computing device 310. If the computing device 310 is not connected to the docking component, the user 312 can be determined to be touching the computing device 310.

In some examples, the controller 302 can wait a predefined amount of time before increasing a temperature threshold and/or determining a thermal profile. The predefined amount of time can be seconds, minutes, and/or defined by a current thermal profile or otherwise defined. By waiting the predefined amount of time, the controller 302 can omit increasing a temperature threshold of the computing device 310 if the user 312 moves away or stops touching the computing device 310 for a brief instance.

Figure 4:
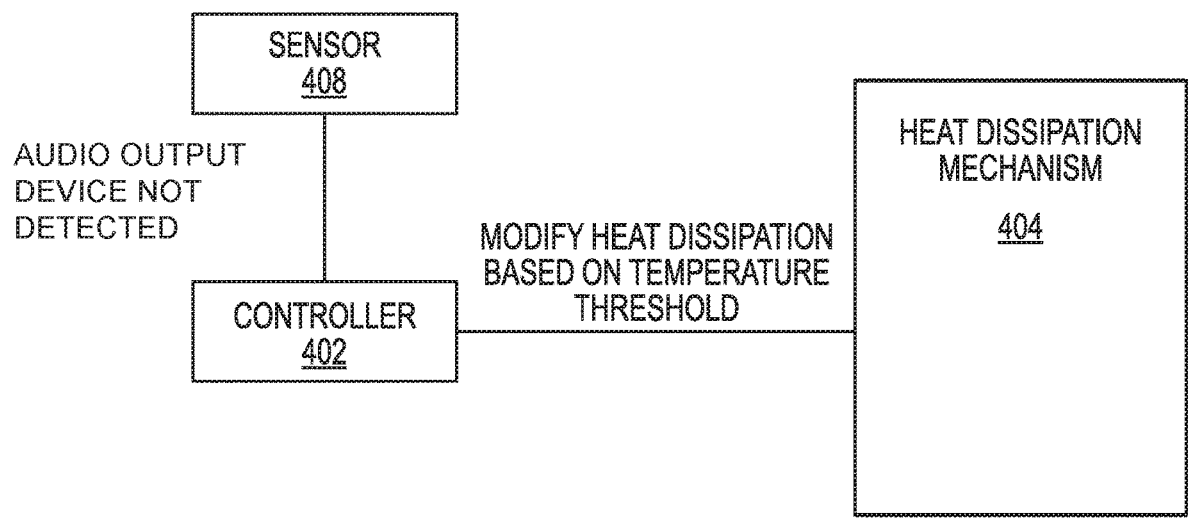
FIG. 4 illustrates a controller to determine thermal profile based on a temperature threshold consistent with the disclosure.

FIG. 4 illustrates a controller 402 to determine a thermal profile based on a temperature threshold consistent with the disclosure. In some examples, as shown in FIG. 4, an audio output device may not be detected by a sensor 408. The sensor 408 can notify the controller 402 that no audio output device is connected to the computing device. In response, the controller 402 can proceed to increase a temperature threshold for the computing device.

In response to the temperature threshold for the computing device increasing, the controller 402 can modify the operation of the heat dissipation mechanism 404. The controller 402 can modify the heat dissipation mechanism 404 to decrease the heat dissipation performance of the heat dissipation mechanism 404. As a result of the decreased heat dissipation performance of the heat dissipation mechanism 404, the sound generated by the heat dissipation mechanism 404 can decrease.

Figure 5:
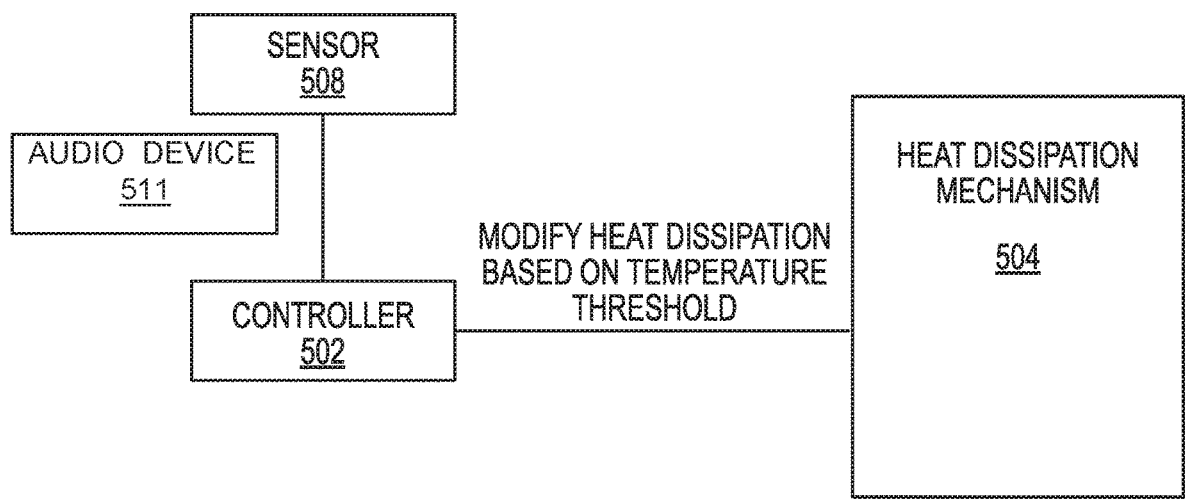
FIG. 5 illustrates a controller to determine a thermal profile based on a temperature threshold consistent with the disclosure.

FIG. 5 is analogous to FIG. 4. As shown in FIG. 5, the sensor 508 can detect an audio output device connected to the computing device. The sensor 508 can notify the controller 502 that an audio output device (represented at 511) is connected to the computing device, In response, the controller 502 can proceed to decrease a temperature threshold for the computing device.

In response to the temperature threshold for the computing device decreasing, the controller 502 can modify the operation of the heat dissipation mechanism 504. The controller 502 can modify the heat dissipation mechanism 504 to increase the heat dissipation performance of the heat dissipation mechanism 504. As a result of the increased heat dissipation performance of the heat dissipation mechanism 504, the sound generated by the heat dissipation mechanism 504 can increase.

Figure 6:
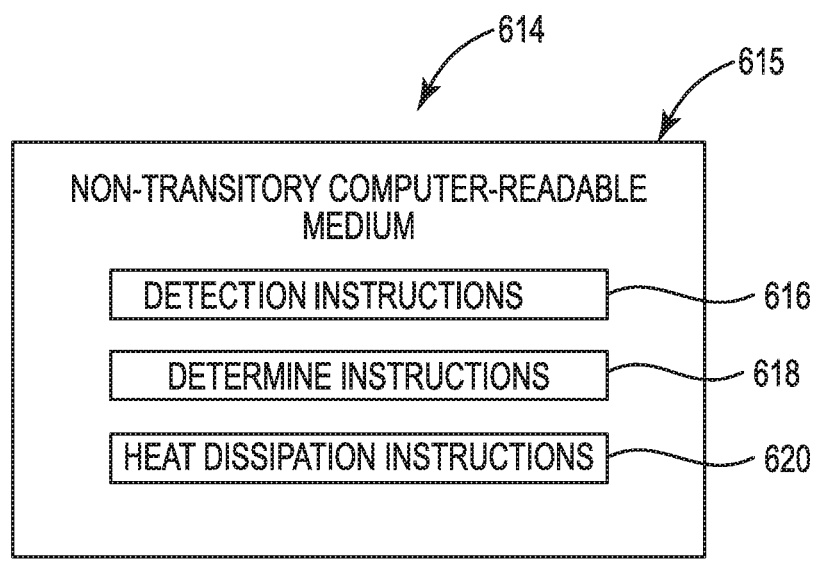
FIG. 6 illustrates a system to determine a thermal profile based on a temperature threshold and dissipate heat in accordance with the thermal profile consistent with the disclosure.

FIG. 6 illustrates a system 614 to determine a thermal profile based on a temperature threshold and dissipate heat in accordance with the thermal profile consistent with the disclosure. System 614 can be a computing device. For example, system 614 can include a non-transitory machine readable medium 615, on which can be stored instructions, such as instructions 616, 618, and 620.

Non-transitory machine readable medium 615 can be electronic, magnetic, optical, or other physical storage device that stores executable instructions. Non-transitory machine readable medium 615 can be Random Access Memory (RAM), an Electrically-Erasable Programmable Read-Only Memory (EEPROM), a storage drive, an optical disc, and the like on-transitory machine readable medium 615 can be disposed within system 614, as shown in FIG. 6. In this example, the executable instructions 616, 618, 620 can be "installed" on the device. Non-transitory machine readable medium 615 can be a portable, external or remote storage medium that allows system 614 to download the instructions 616, 618, 620 from the portable/external/remote storage medium, In this situation, the executable instructions can be part of an "installation package".

Detection instructions 616 can include instructions to detect a type of audio output device to output audio of a computing device. For example, a sensor can detect whether headphones or internal speakers of the computing device are to output the audio of the computing device.

In some examples, the medium 615 can include instructions (not illustrated) to detect whether an audio device is connected to a computing device. Detecting can include using sensors to detect whether headphones or a headset including headphones and a microphone are connected to the computing device. Detecting can also include detecting contact with a computing device and whether that contact is with a hand or an object, such as a stylus.

Determine instructions 618 can include instructions to determine a thermal profile. A thermal profile can be determined based on the detection of whether an audio output device is connected to the computing device and/or a type of audio output device to output audio from the computing device, as detailed herein. For example, a determination that an audio output device including a microphone is connected to a computing device can have a corresponding temperature profile with a higher temperature threshold, as compared to a thermal profile corresponding to a determination that an audio output device does not include a microphone.

Heat dissipation instructions 620 can include instructing a heat dissipation mechanism to dissipate heat from the computing device. The heat dissipation mechanism can be instructed to dissipate heat in accordance with a determined thermal profile. The determined thermal profile can include a temperature threshold.

The figures herein follow a numbering convention in which the first digit corresponds to the drawing figure number and the remaining digits identify an element or component in the drawing. Elements shown in the various figures herein can be added, exchanged, and/or eliminated so as to provide a plurality of additional examples of the disclosure. In addition, the proportion and the relative scale of the elements provided in the figures are intended to illustrate the examples of the disclosure and should not be taken in a limiting sense.

What is claims is:

1. An apparatus comprising:
   a heat dissipation mechanism; and
   a controller to:
   detect a temperature of a surface of the apparatus;
   in response to detecting that a type of an external audio output device of a plurality of different types of external audio output devices is connected to the apparatus, determine a thermal profile having a temperature threshold based on the type of the external audio device connected to the apparatus; and
   instruct the heat dissipation mechanism to dissipate heat from the apparatus based on the temperature threshold of the thermal profile and the type of external audio output device being connected to the apparatus.

2. The apparatus of claim 1, wherein the detected external audio output device includes headphones.

3. The apparatus of claim 1, wherein the detected external audio output device is a headset including headphones and a microphone.

4. The apparatus of claim 1, wherein the controller is to display a plurality of temperature thresholds via a display of the apparatus, and wherein the temperature threshold is selectable from the plurality of displayed temperature thresholds.

5. The apparatus of claim 1, wherein the apparatus further includes a memory component, wherein the memory component is to store a plurality of thermal profiles, wherein each thermal profile of the plurality of the thermal profiles includes a distinct temperature threshold.

6. The apparatus of claim 1, wherein the detected external audio output device is external to a housing of the apparatus.

7. A non-transitory computer-readable medium comprising instructions when executed cause a processor of a computing device to:
   detect, from a plurality of different types of external audio output devices, a type of external audio output device connected to the computing device to output audio of the computing device;
   determine a thermal profile having a temperature threshold based on the type of external audio output device; and
   instruct a heat dissipation mechanism to dissipate heat from the computing device based on the thermal profile and the type of external audio output device being connected to the computing device.

8. The medium of claim 7, further comprising instructions to detect whether the type of the external audio output device is connected to the computing device.

9. The medium of claim 7 further comprising instructions to detect contact with the computing device, wherein the contact is with a hand or an object, wherein the object is a stylus.

10. A computing device comprising:
    a sensor to:
    detect whether an external audio output device is connected to the computing device; and
    determine, from a plurality of different types of external audio devices, a type of external audio device connected to the computing device; and a controller to:
- determine a first temperature threshold of a first thermal profile responsive to an absence of the detection of the external audio output device connected to the computing device;
- instruct a heat dissipation mechanism to dissipate heat from the computing device in accordance with the first temperature threshold;
- determine a second temperature threshold of a second thermal profile of the computing device responsive to the detection of the external audio output device connected to the computing device wherein the second thermal profile is determined based on the type of the external audio device connected to the computing device; and
- instruct a heat dissipation mechanism to dissipate heat from the computing device based on the second temperature threshold of the second thermal profile and the type of external audio output device.

11. The computing device of claim 10, wherein the heat dissipation mechanism includes a blower.

12. The computing device of claim 10, wherein the second temperature threshold is lower than the first temperature threshold when headphones are connected to the computing device.

13. The computing device of claim 10, wherein the second temperature threshold is higher than the first temperature threshold when a headset featuring headphones and a microphone is connected to the computing device.

14. The computing device of claim 10, further comprising a display, wherein the second temperature threshold is higher than the first temperature threshold when video content is shown on the display.

15. The computing device of claim 10, wherein the controller is to:
- detect a mode of operation of the computing device; and
- determine a thermal profile corresponding to the detected mode of operation of the computing device.

16. The computing device of claim 10, wherein the second temperature threshold is higher than the first temperature threshold when the computing device receives a signal from a wireless keyboard, the signal representative of an input received by the wireless keyboard.

* * * * *